United States Patent
Menuey et al.

(10) Patent No.: US 10,745,800 B2
(45) Date of Patent: Aug. 18, 2020

(54) COATING FOR PROTECTION AGAINST OXIDATION AND AGAINST HOT CORROSION ON A SUPERALLOY SUBSTRATE

(71) Applicant: SAFRAN AIRCRAFT ENGINES, Paris (FR)

(72) Inventors: Justine Menuey, Annecy (FR); Sarah Hamadi, Paris (FR); Andre Hubert Louis Malie, Chatellerault (FR)

(73) Assignee: SAFRAN AIRCRAFT ENGINES, Paris (FR)

( * ) Notice: Subject to any disclaimer, the term of this patent is extended or adjusted under 35 U.S.C. 154(b) by 0 days.

(21) Appl. No.: 14/944,412

(22) Filed: Nov. 18, 2015

(65) Prior Publication Data

US 2016/0068950 A1 Mar. 10, 2016

Related U.S. Application Data

(62) Division of application No. 13/270,466, filed on Oct. 11, 2011, now Pat. No. 9,228,264.

(30) Foreign Application Priority Data

Oct. 14, 2010 (FR) ..................................... 10 58362

(51) Int. Cl.
*C23C 16/06* (2006.01)
*C23C 16/08* (2006.01)
(Continued)

(52) U.S. Cl.
CPC .............. *C23C 16/08* (2013.01); *C23C 14/00* (2013.01); *C23C 14/02* (2013.01); *C23C 14/027* (2013.01);
(Continued)

(58) Field of Classification Search
CPC ... C23C 28/023; C23C 28/022; C23C 28/325; C23C 28/3455; C23C 28/021;
(Continued)

(56) References Cited

U.S. PATENT DOCUMENTS 5,900,326 A 5/1999 Bornstein et al.
6,110,262 A 8/2000 Kircher et al.
(Continued)

FOREIGN PATENT DOCUMENTS

EP 1 652 959 A1 5/2006
FR 2 928 664 9/2009

OTHER PUBLICATIONS

Sarah Hamadi, "ÔEtude du comportement en oxydation de nouveaux revÔetements en aluminiure de nickel dopÔe au zirconium. Application aux barriÔeres thermiques," Chemical Sciences. UniversitÔe Pierre et Marie Curie—Paris VI, 2009 (no month). English. <pastel-00006150>.*

(Continued)

*Primary Examiner* — Michael E. La Villa
(74) *Attorney, Agent, or Firm* — Oblon, McClelland, Maier & Neustadt, L.L.P.

(57) ABSTRACT

To protect a superalloy substrate from oxidation and hot corrosion, disclosed herein is coating made by a process that deposits successive layers on the substrate, a first layer of aluminium and of at least one element capable of being alloyed with sulphur, and a second layer of a material that isolates the at least one element capable of being alloyed with sulphur.

10 Claims, 1 Drawing Sheet

(51) Int. Cl.
  *C23C 28/00* (2006.01)
  *F01D 5/28* (2006.01)
  *C23C 28/02* (2006.01)
  *C23C 14/00* (2006.01)
  *C23C 14/58* (2006.01)
  *C23C 14/14* (2006.01)
  *C23C 14/16* (2006.01)
  *C23C 30/00* (2006.01)
  *C23C 14/02* (2006.01)

(52) U.S. Cl.
  CPC ............ *C23C 14/14* (2013.01); *C23C 14/16* (2013.01); *C23C 14/58* (2013.01); *C23C 16/06* (2013.01); *C23C 28/021* (2013.01); *C23C 28/022* (2013.01); *C23C 28/023* (2013.01); *C23C 28/028* (2013.01); *C23C 28/321* (2013.01); *C23C 28/325* (2013.01); *C23C 28/3215* (2013.01); *C23C 28/3455* (2013.01); *C23C 30/00* (2013.01); *C23C 30/005* (2013.01); *F01D 5/288* (2013.01); *Y02T 50/67* (2013.01); *Y02T 50/6765* (2018.05); *Y10T 428/1266* (2015.01); *Y10T 428/1275* (2015.01); *Y10T 428/12611* (2015.01); *Y10T 428/12618* (2015.01); *Y10T 428/12757* (2015.01); *Y10T 428/12875* (2015.01); *Y10T 428/12931* (2015.01); *Y10T 428/12944* (2015.01); *Y10T 428/12972* (2015.01); *Y10T 428/12979* (2015.01)

(58) Field of Classification Search
  CPC ... C23C 30/005; C23C 30/00; C23C 28/3215; C23C 28/028; C23C 28/321; C23C 16/06; C23C 16/08; C23C 14/00; C23C 14/02; C23C 14/027; C23C 14/14; C23C 14/16; C23C 14/58; Y10T 428/12944; Y10T 428/12931; Y10T 428/12972; Y10T 428/12979; Y10T 428/1275; Y10T 428/12757; Y10T 428/12875; Y10T 428/1266; Y10T 428/12611; Y10T 428/12618; Y02T 50/6765; Y02T 50/67; F01D 5/288
  See application file for complete search history.

(56) References Cited

U.S. PATENT DOCUMENTS

| | | |
|---|---|---|
| 2002/0155316 A1 | 10/2002 | Zheng |
| 2003/0044633 A1 | 3/2003 | Nagaraj et al. |
| 2003/0211239 A1 | 11/2003 | Grylls et al. |
| 2004/0194858 A1 | 10/2004 | Bacos et al. |
| 2006/0093851 A1 | 5/2006 | Darolia et al. |
| 2007/0071996 A1 | 3/2007 | Hazel et al. |
| 2009/0075115 A1 | 3/2009 | Tryon et al. |
| 2009/0092826 A1 | 4/2009 | Carlin et al. |
| 2011/0014370 A1 | 1/2011 | Brossier et al. |

OTHER PUBLICATIONS

Bibliographic Information pertaining to Sarah Hamadi, "ÔEtude du comportement en oxydation de nouveaux revÔetements en aluminiure de nickel dopÔe au zirconium. Application aux barriÔeres thermiques," Chemical Sciences. UniversitÔe Pierre et Marie Curie—Paris VI, 2009 (no month). English. <pastel-00006150> (no date).*

S. Hamadi, "Oxidation Resistance of a Zr-doped NiAl coating . . . ," Surface & Coatings Technology, 204 (2009), 756-60 (no month).*

Hamadi in "ÔEtude du comportement en oxydation de nouveaux revÔetements en aluminiure de nickel dopÔe au zirconium. Application aux barriÔeres thermiques." Chemical Sciences. UniversitÔe Pierre et Marie Curie—Paris VI, 2009. English. <pastel-00006150> (Figures 1.3, 2.6 and 2.7; and pp. 28-33).*

French Preliminary Search Report dated Mar. 30, 2011, in French 1058362, filed Oct. 14, 2010 (with English Translation of Categories of Cited Documents).

Caporali, Stefano, et al., "Aluminum electroplated from ionic liquids as protective coating against steel corrosion". Corrosion Science, 50 (2008) 534-539.

Sun, Jie, et al., "Thermal corrosion behavior of NiCoCrAlTaY coating for a Ni base superalloy prepared by low pressure plasma spraying". Procedia Engineering 27 (2012) 983-988.

Chatha, Sukhpal Singh, et al., "Characterisation and Corrosion-Erosion Behavior of Carbide based Thermal spray coatings" Journal of Minerals & Materials Characterization & Engineering. vol. 11, No. 6, pp. 569-586, 2012.

* cited by examiner

COATING FOR PROTECTION AGAINST OXIDATION AND AGAINST HOT CORROSION ON A SUPERALLOY SUBSTRATE

This application is a divisional of U.S. application Ser. No. 13/270,466 filed Oct. 11, 2011, allowed, and claims the benefit of FR 1058362 filed Oct. 14, 2010.

The field of the present invention is that of turbomachines and, more particularly, that of parts of these turbomachines which are subjected to high temperatures.

A turbomachine, such as used for propulsion in the aeronautical field, comprises an atmospheric air intake that communicates with one or more compressors, generally including a fan, which are rotated about one and the same axis. The main stream of this air, after having been compressed, supplies a combustion chamber positioned annularly around this axis and is mixed with a fuel to provide hot gases, downstream, to one or more turbines through which these hot gases are expanded, the turbine rotors driving the rotors of the compressors. The engines operate at a turbine inlet temperature, which is sought to be as high as possible because this temperature conditions the performances of the turbomachine. For this purpose, the materials of the hot sections are selected to withstand these operating conditions and the walls of the parts swept by the hot gases, such as the turbine nozzles or the rotating turbine blades, are provided with cooling means. Furthermore, due to the metallic structure of these blades, made of a superalloy based on nickel or on cobalt, it is also necessary to protect them against the erosion and corrosion which are generated by the constituents of the engine gases at these temperatures.

Among the protections devised for enabling these parts to resist these extreme conditions is the deposition of a coating, forming a thermal barrier, on their outer face. A thermal barrier is generally composed of a ceramic layer of at least about a hundred microns, which is deposited at the surface of the metallic layer. It may be produced in several ways, depending on the use which will be made thereof. Two types of structures are roughly distinguished for thermal barriers: columnar barriers, the structure of which is that of columns juxtaposed against one another and which extend perpendicular to the surface of the substrate, and lamellar barriers which extend in uniform layers over the surface of the substrate.

A sublayer, of a few tens of microns, is arranged between the ceramic thermal barrier and the metallic superalloy substrate. It itself forms a coating that provides the bonding between these two components and also protection against oxidation and hot corrosion of the thermal barrier system so as to guarantee a service life in accordance with the specifications. Service life forecasting models are essential tools for the technical choices and defining of the engine overhaul and repair policies.

The service life corresponds to the behaviour in terms of the number of thermal cycles to which the thermal barrier is subjected before flaking of this barrier or a loss of mass occurs.

One factor that has a negative impact and a considerable influence on the flaking resistance or on the loss of mass, in view of the thermal cycles, is the presence of sulphur. Particular care is taken during the production of the superalloy in order to limit the presence thereof. Despite this, this element may still be introduced during the production of the coating that forms the layer between the substrate and the thermal barrier.

It follows that coatings produced according to conventional methods are liable to see their service life reduced due to the presence of sulphur.

A known coating is formed from an aluminium-based layer, which is generally deposited via a vapour phase aluminization process and attaches to the substrate by metallic interdiffusion and forms a protective surface oxide layer. The additional layer is distinguished from the diffused layer. The thickness of the coating is of the order of a few tens of microns. An exemplary embodiment of this technique is described in patent application FR 2928664 by the applicant.

Also known are the coatings formed of an alloy of the MCrAlY gamma/gamma prime type where M denotes at least one of the elements Co, Ni and Fe. The latter coatings give good oxidation resistance and corrosion resistance results, the sulphur having less influence on these than on aluminides. However, sulphur is introduced during the production of these coatings. Neither its content nor the place that it occupies within the coating can be controlled.

One subject of the present invention is a process for depositing a coating for protection against oxidation and against hot corrosion on a metallic superalloy substrate which appears to be capable of preventing the damage caused by the presence of sulphur.

More particularly, one subject of the invention is a process which makes it possible to form a deposit that traps any sulphur particle and to ensure that the surface of the coating subjacent to the thermal barrier is kept at a distance, in particular it makes it possible to locate this deposit solely at the interface between the additional layer of the coating and the diffused layer of the coating.

In accordance with the invention, this objective is achieved with a process characterized by the fact that it comprises the formation of the following layers on the substrate:

a first layer of aluminium and of at least one element capable of being alloyed with sulphur, a second layer of a material that isolates said element capable of being alloyed with sulphur.

The invention results from the observation that the sulphur is a problem when it is mobile and when it rises to the surface of the coating, since it can disturb the oxide layer that is formed, alumina in particular.

The solution of the invention therefore consisted in adding species or elements that can be easily alloyed with the sulphur to halt its progression.

In particular, the element capable of being alloyed with sulphur is chosen from a reactive element such as zirconium, hafnium, yttrium or silicon or a rare earth element such as cerium or lanthanum or gadolinium.

However, insofar as this type of species should not be too close to the surface of the coating since it would be oxidized very rapidly at the operating temperature of the part protected by this coating, the process of the invention includes the formation of a second layer with an isolating material. Preferably, this is aluminium.

Also preferably, the aluminium and the element capable of being alloyed with sulphur are deposited via a thermochemical route.

Finally, in order to be sure that the coating has good oxidation and corrosion properties, a layer of platinum is added at the surface which is heat treated. Advantageously, the process includes the formation of a layer containing platinum and at least 35 wt % of nickel.

Another subject of the invention is a novel coating for protecting a metallic superalloy substrate against oxidation and against hot corrosion. The coating in accordance with the invention comprises a βNiAl phase with the platinum element, at least one additional element from the group formed of the reactive elements zirconium, hafnium, yttrium or silicon and of the rare earth elements cerium, lanthanum and gadolinium, the additional element forming a concentration peak, especially at the interface between the additional layer and the diffused layer.

The invention will be better understood, and other objectives, details, characteristics and advantages thereof will appear more clearly in the course of the following detailed explanatory description of an embodiment of the invention given by way of a purely illustrative and nonlimiting example, with reference to the appended schematic drawings.

Figure 1:
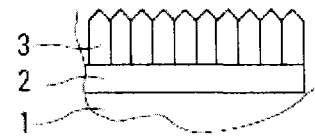
FIG. 1 represents, in cross section, protection of a part with a thermal barrier on an intermediate layer constituting the coating that is the subject of the invention, between the barrier and the substrate.

With reference to FIG. 1, seen in cross section is a thermal barrier deposited on the surface of a turbine blade, this being shrouded by a stream of hot gas. The metal constituting the blade, typically a superalloy based on nickel or cobalt, forms a substrate 1, deposited on which is an aluminium-based sublayer 2, sandwiched between the substrate 1 and a ceramic layer 3. The role of the sublayer is to retain the ceramic layer and to impart a certain elasticity to the assembly in order to enable it to absorb the difference in expansion, which exists between the high-expansion substrate 1 and the low-expansion ceramic 3.

For the rest, the invention is described relative to a substrate made of a nickel-based superalloy.

The substrate constituting the material of the blade to be protected is first covered with an aluminium-based coating capable of constituting a thermal barrier sublayer. The nickel combines with the aluminium to form, in the coating, an NiAl intermetallic compound.

In accordance with the invention, the coating is formed in several layers. A first layer containing aluminium and an element capable of being alloyed with sulphur is deposited. Such an element may be a reactive element such as zirconium or hafnium, yttrium or silicon or else a rare earth element such as cerium.

By way of example, this element is zirconium.

Figure 2:
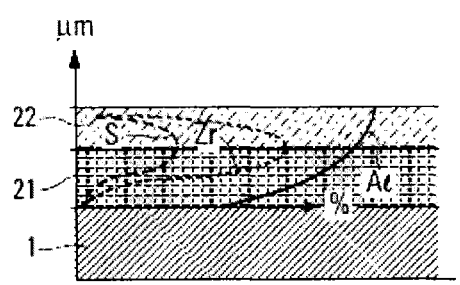
FIG. 2 shows, in cross section, the coating during formation according to the first step of an embodiment of the process with a first layer incorporating a sulphur-capturing element; the concentration as a function of the depth is represented in superposition with the cross section.

Use is then advantageously made, in this case, of a particular vapour phase aluminization deposition process which makes it possible to locate the zirconium so that it has a concentration peak in the zone forming the interface between the diffusion zone 21 and the additional zone 22, as represented in FIG. 2 where Zr is zirconium, S is sulphur and Al is aluminium. It is observed that the concentration curve of the sulphur coincides in shape with that of the zirconium.

One process for arriving at this result is the following, the part and a cement made of aluminium alloy are brought into contact with a gas at a treatment temperature in a treatment chamber, the gas comprising a carrier gas and an activator. The gaseous activator reacts with the cement to form a gaseous aluminium halide, which decomposes at the surface of the part, depositing metallic aluminium thereon. Here the gaseous activator contains a zirconium salt, such as $ZrOCl_2$, obtained from zirconium salt granules.

The part, the cement and the zirconium salt granules are gradually heated together in the chamber from ambient temperature up to the treatment temperature which is between 950 and 1200° C. and preferably around 1080° C. The dissociation reactions of the zirconium salt take place in a dissociation temperature range between 200° C. and 700° C., which leads to the formation of a deposit of Zr metal at the surface of the part.

By playing with the chemical reactions that take place at the various stages of the heat treatment, the deposit of zirconium is obtained at the diffused layer/additional layer interface. Thus, this result is obtained when the treatment chamber is maintained in overpressure without circulation of carrier gas over the temperature range corresponding to the dissociation reactions of the zirconium salt.

Other characteristics of this step of forming the layer with the element zirconium are:

A rise in temperature with a hold, in accordance with one particular embodiment of the process, between 200° C. and 700° C., preferably between 300 and 600° C. This range corresponds to the temperatures of the dissociation reactions of the activator.

The duration of the heating hold is from 5 to 30 minutes.

The treatment unit forming the chamber is semi-sealed and the overpressure is slightly above atmospheric pressure so as to allow the transition gases not to be driven from the reaction zone.

The carrier gas is circulated through the chamber after the temperature of the chamber has exceeded said temperature range.

The chamber is heated gradually at a heating rate of between 4 and 20° C. per minute.

The activator also contains at least one ammonium halide.

The carrier gas is a reducing gas, such as $H_2$, or an inert gas, such as argon.

The element zirconium may be replaced by hafnium or yttrium.

Other methods of depositing an element capable of capturing the sulphur and of fixing it in the diffusion layer or not, are possible.

Figure 3:
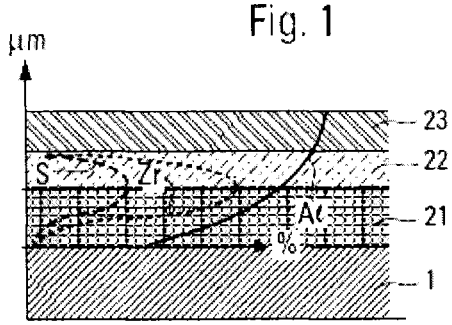
FIG. 3 shows, in cross section, the coating during formation according to the second step of the process.

For the purpose of ensuring the isolation of this or these elements from the surface of the coating where they would rapidly oxidize, a layer of aluminium is deposited. This layer may be formed by vapour phase aluminization so as to form βNiAl aluminides, or by any other means. FIG. 3 illustrates the composition of the coating at this stage. In the layer 23, the element Al forms a layer on top of the layers 21 and 22, isolating the elements S and Zr.

Figure 4:
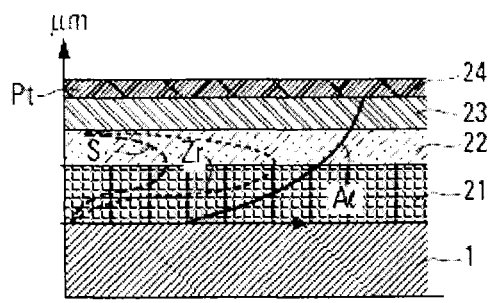
FIG. 4 shows, in cross section, the coating during formation according to the third step of the process.

The production of the coating is continued by the deposition of a layer of platinum 24, FIG. 4, so as to provide the coating with good oxidation and corrosion properties.

Figure 5:
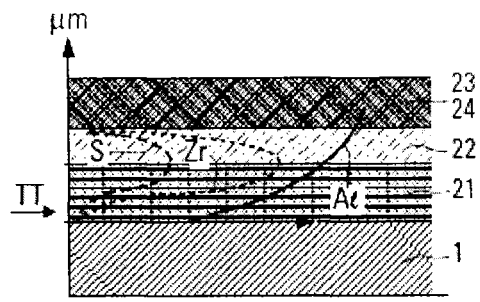
FIG. 5 shows, in cross section, the coating during formation according to the fourth step of the process.

Next, a diffusion heat treatment is carried out that is intended to diffuse the platinum into the subjacent layers and to enrich them with platinum. This treatment is carried out in a chamber under vacuum and at high temperature, for example 1100° C., for two hours, see FIG. 5.

In accordance with one particular embodiment of the process, the coating is completed by the deposition of a layer of nickel.

Figure 6:
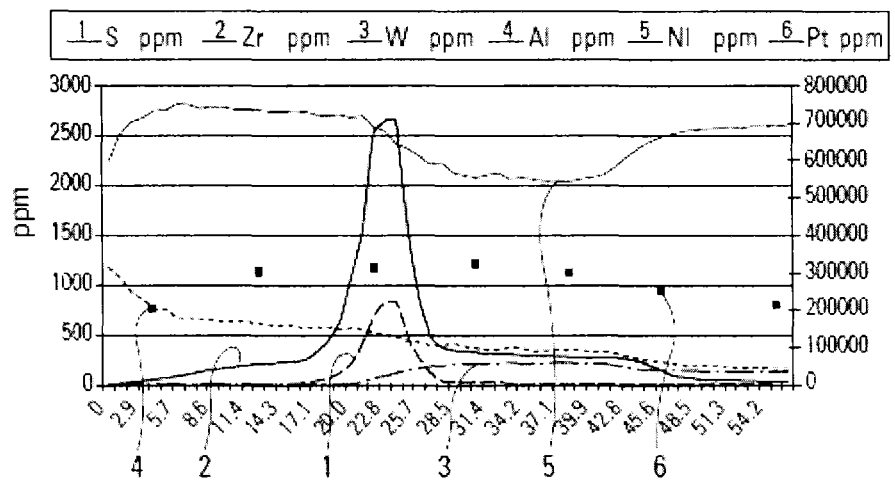
FIG. 6 shows the concentration profile of the elements in the coating thus formed.

FIG. 6 is a diagram of the concentrations of the elements in the coating obtained by the process of the invention. The left-hand scale gives the concentration in ppm (parts per million) of sulphur and of zirconium, the right-hand scale gives that of the elements tungsten, aluminium, nickel and platinum. It is observed that the sulphur has a concentration peak with the zirconium in the interface zone between the additional layer and the diffusion layer, characterized by the increase in the concentration of tungsten.

The invention claimed is:

1. A metallic superalloy substrate, comprising sulphur and a coating that protects the metallic superalloy substrate against oxidation and hot corrosion, the coating comprising
   a first layer comprising aluminium and a reactive element that is capable of being alloyed with the sulphur the reactive element being selected from the group consisting of zirconium, hafnium, yttrium, cerium, lanthanum and gadolinium, the first layer forming a diffusion zone above the metallic superalloy substrate, and
   a second layer disposed on the first layer, the second layer comprising a material that isolates and traps the reactive element and the sulphur in the second layer,
   wherein the reactive element capable of being alloyed with sulphur has a concentration peak in an interface zone and coincides with a concentration peak of the sulphur at the interface zone, and
   wherein the metallic superalloy substrate and the coating is subjected to diffusion heat treatment so that the reactive element stops progressions of the sulfur towards the external surface of the second layer and traps sulfur in the interface zone, the reactive element and the sulphur are not present on the external surface of the second layer to avoid oxidation.

2. The metallic superalloy substrate of claim 1, wherein the first layer is formed by a diffusion zone and an additional zone, the interface zone being formed between the diffusion zone and the additional zone, the reactive element is alloyed with sulfur and has a concentration peak in the interface zone between the diffusion zone and the additional zone, wherein the concentration peak of the reactive element coincides with a concentration peak of sulphur at the interface zone.

3. The metallic superalloy substrate of claim 1, wherein the first layer forms a diffused layer and an additional layer, said additional layer comprising the reactive element, the reactive element having a concentration peak being at the interface between the diffused layer and the additional layer.

4. The metallic superalloy substrate of claim 1, wherein the reactive element is alloyed with sulphur and isolates the sulphur between the first and second layers.

5. A coated metallic superalloy substrate obtained by a process comprising
   depositing, on the metallic superalloy substrate, a first layer of aluminium and an element capable of being alloyed with sulphur by a vapour phase aluminization process,
   depositing by chemical vapour deposition a second layer of a material that isolates said element capable of being alloyed with sulphur on the first layer, and
   diffusion heat treating the metallic superalloy substrate, wherein
   the reactive element being selected from the group consisting of zirconium, hafnium, yttrium, cerium, lanthanum and gadolinium, the first layer forming a diffusion zone above the metallic superalloy substrate,
   wherein the reactive element capable of being alloyed with sulphur has a concentration peak in an interface zone and coincides with a concentration peak of the sulphur at the interface zone between the first and second layers, and
   after diffusion heat treatment of the metallic superalloy substrate and the coating, the reactive element stops progressions of the sulfur towards the external surface of the second layer and traps sulfur in the interface zone, the reactive element and the sulphur are not present on the external surface of the second layer to avoid oxidation.

6. The coated metallic superalloy substrate of claim 5, further comprising a third layer disposed on the second layer, the third layer comprising platinum.

7. The coated metallic superalloy substrate of claim 6, further comprising a ceramic layer on the third layer.

8. The metallic superalloy substrate of claim 6, wherein the second layer comprises aluminium and platinum after the diffusion heat treatment.

9. The coated metallic superalloy substrate of claim 5, wherein the element capable of being alloyed with sulphur is zirconium.

10. A coated metallic superalloy substrate comprising:
    a substrate comprising sulfur,
    a coating disposed on the substrate to protect said substrate against oxidation and hot corrosion, the coating having a surface and comprising:
    a first layer comprising aluminium and a reactive element that is capable of being alloyed with the sulphur the reactive element being selected from the group consisting of zirconium, hafnium, yttrium, cerium, lanthanum and gadolinium, the first layer forming a diffusion zone above the metallic superalloy substrate, and
    a second layer disposed on the first layer, the second layer comprising a material that isolates and traps the reactive element and the sulphur in the second layer,
    wherein the reactive element capable of being alloyed with sulphur has a concentration peak in an interface zone and coincides with a concentration peak of the sulphur at the interface zone between the first and second layers, and
    wherein after diffusion heat treatment of the metallic superalloy substrate and the coating, the reactive element stops progressions of the sulfur towards the external surface of the second layer and traps sulfur in the interface zone, the reactive element and the sulphur are not present on the external surface of the second layer to avoid oxidation.

* * * * *